US006388930B1

(12) United States Patent
Obremski

(10) Patent No.: US 6,388,930 B1
(45) Date of Patent: May 14, 2002

(54) METHOD AND APPARATUS FOR RAM BUILT-IN SELF TEST (BIST) ADDRESS GENERATION USING BIT-WISE MASKING OF COUNTERS

(75) Inventor: Thomas E. Obremski, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/946,409

(22) Filed: Sep. 5, 2001

(51) Int. Cl.[7] .............................................. G11C 29/00
(52) U.S. Cl. ......................... 365/201; 365/236; 714/718
(58) Field of Search ................................ 365/201, 236, 365/239, 240, 189.12; 714/718

(56) References Cited

U.S. PATENT DOCUMENTS

| | | | |
|---|---|---|---|
| 5,173,906 A | | 12/1992 | Dreibelbis et al. .......... 714/718 |
| 5,535,164 A | * | 7/1996 | Adams et al. .............. 365/201 |
| 5,844,917 A | | 12/1998 | Kim et al. ................. 371/21.1 |
| 5,923,599 A | | 7/1999 | Hii et al. ................... 365/201 |
| 5,946,246 A | | 8/1999 | Jun et al. ................... 365/201 |
| 5,961,653 A | | 10/1999 | Kalter et al. .................. 714/7 |
| 6,108,252 A | * | 8/2000 | Park ......................... 365/201 |
| 6,230,290 B1 | | 5/2001 | Keidel et al. .............. 714/718 |
| 6,272,588 B1 | * | 8/2001 | Johnston et al. ............ 711/106 |

OTHER PUBLICATIONS

"Embedded DRAM Built In Self Test and Methodology for Test Insertion," Peter Jakobsen, Jeffrey Dreibelbis, Gary Pomichter, Darren Anand, John Barth, Michael Nelms, Jeffrey Leach, and George Belansek; Mar. 14, 2001, pp. 1–10.

"A 256Meg SDRAM BIST for Distrub Test Application," International Test Conf erence; Paper 9.1; Theo J. Powell, Francis Hii, and Dan Cline; 1997, pp. 200–208.

"Processor–Based Built–In Self–Test for Ebedded DRAM," IEEE Journal of Solid–State Circuits, vol. 33, No. 11, Nov. 1998; Jeffrey Dreibelbis, John Barth, Howard Kalter, and Rex Kho; pp. 1731–1740.

"Test and Diagnosis of Embedded Memory Using BIST," Evaluation Engineering, Ian Burgess; 2000; pp. 1–6.

"Built–In Self Test of DRAM Chips—An Overview of Issues and Papers," pp. 1–5.

* cited by examiner

*Primary Examiner*—Son T. Dinh
(74) *Attorney, Agent, or Firm*—H. J. Walter; Cantor Colburn LLP

(57) ABSTRACT

A method for generating a selected subset of memory addresses associated with a semiconductor memory array is disclosed. In an exemplary embodiment of the invention, the method includes configuring an address counter to generate addresses corresponding to locations within the memory array. A mask register is programmed with a series of masking bits, the value of the masking bits determining whether corresponding address bits in the address counter are masked or not masked. Any of the address bits in the address counter corresponding to a masked bit are masked from a counting operation performed by the address counter, thereby causing the address counter to generate the selected subset of memory addresses.

20 Claims, 5 Drawing Sheets

|  |  | COUNTER MASK |  |  |  |  |  |  |  |
|---|---|---|---|---|---|---|---|---|---|
| CARRY |  | 1 | 0 | 1 | 1 | 0 | 0 | 1 | 0 |
|  |  | COUNTER BITS |  |  |  |  |  |  |  |
| CLOCK CYCLE |  | 7 | 6 | 5 | 4 | 3 | 2 | 1 | 0 |
| 0 | 0 | 0 | 0 | 0 | 0 | 0 | 0 | 0 | 0 |
| 1 | 0 | 0 | 0 | 0 | 0 | 0 | 0 | 0 | 1 |
| 2 | 0 | 0 | 0 | 0 | 0 | 0 | 0 | 0 | 0 |
| 3 | 0 | 0 | 0 | 0 | 0 | 1 | 0 | 0 | 1 |
| 4 | 0 | 0 | 0 | 0 | 1 | 0 | 0 | 0 | 0 |
| 5 | 0 | 0 | 0 | 0 | 1 | 1 | 0 | 0 | 1 |
| 6 | 0 | 0 | 0 | 0 | 1 | 1 | 0 | 0 | 0 |
| 7 | 0 | 0 | 0 | 0 | 1 | 1 | 0 | 0 | 1 |
| 8 | 0 | 0 | 1 | 0 | 0 | 0 | 0 | 0 | 0 |
| 9 | 0 | 0 | 1 | 0 | 0 | 1 | 0 | 0 | 1 |
| 10 | 0 | 0 | 1 | 0 | 1 | 0 | 0 | 0 | 0 |
| 11 | 0 | 0 | 1 | 0 | 1 | 1 | 0 | 0 | 1 |
| 12 | 0 | 0 | 1 | 0 | 1 | 1 | 0 | 0 | 0 |
| 13 | 0 | 0 | 1 | 0 | 1 | 1 | 0 | 0 | 1 |
| 14 | 1 | 0 | 1 | 0 | 1 | 1 | 0 | 0 | 0 |
| 15 | 0 | 0 | 0 | 0 | 0 | 0 | 0 | 0 | 1 |
| 16 | 0 | 0 | 0 | 0 | 0 | 0 | 0 | 0 | 0 |

FIG. 4(a)

|  |  | COUNTER MASK |  |  |  |  |  |  |  |
|---|---|---|---|---|---|---|---|---|---|
| CARRY |  | 1 | 0 | 1 | 1 | 0 | 0 | 1 | 0 |
|  |  | COUNTER BITS |  |  |  |  |  |  |  |
| CLOCK CYCLE |  | 7 | 6 | 5 | 4 | 3 | 2 | 1 | 0 |
| 0 | 0 | 1 | 0 | 0 | 0 | 0 | 1 | 0 | 0 |
| 1 | 0 | 1 | 0 | 0 | 0 | 0 | 1 | 0 | 1 |
| 2 | 0 | 1 | 0 | 0 | 0 | 1 | 1 | 0 | 0 |
| 3 | 0 | 1 | 0 | 0 | 0 | 1 | 1 | 0 | 1 |
| 4 | 0 | 1 | 0 | 0 | 1 | 0 | 1 | 0 | 0 |
| 5 | 0 | 1 | 0 | 0 | 1 | 0 | 1 | 0 | 1 |
| 6 | 0 | 1 | 0 | 0 | 1 | 1 | 1 | 0 | 0 |
| 7 | 0 | 1 | 0 | 0 | 1 | 1 | 1 | 0 | 1 |
| 8 | 0 | 1 | 1 | 0 | 0 | 0 | 1 | 0 | 0 |
| 9 | 0 | 1 | 1 | 0 | 0 | 0 | 1 | 0 | 1 |
| 10 | 0 | 1 | 1 | 0 | 0 | 1 | 1 | 0 | 0 |
| 11 | 0 | 1 | 1 | 0 | 0 | 1 | 1 | 0 | 1 |
| 12 | 0 | 1 | 1 | 0 | 1 | 0 | 1 | 0 | 0 |
| 13 | 0 | 1 | 1 | 0 | 1 | 0 | 1 | 0 | 1 |
| 14 | 1 | 1 | 1 | 0 | 1 | 1 | 1 | 0 | 0 |
| 15 | 0 | 1 | 0 | 0 | 0 | 0 | 1 | 0 | 1 |
| 16 | 0 | 1 | 0 | 0 | 0 | 0 | 1 | 0 | 0 |

FIG. 4(b)

| SIMULATION TEST NUMBER | STARTING ADDRESS | INCREMENT/ DECREMENT | MASK INVERSION | MASK VALUE |
|---|---|---|---|---|
| 1 | 0000 | INC | NON-INVERTED | 1111 |
| 2 | 0000 | DEC | NON-INVERTED | 1111 |
| 3 | 0101 | INC | NON-INVERTED | 1111 |
| 4 | 0101 | DEC | NON-INVERTED | 1111 |
| 5 | 0000 | INC | NON-INVERTED | 1110 |
| 6 | 0000 | DEC | NON-INVERTED | 1110 |
| 7 | 0101 | INC | NON-INVERTED | 1110 |
| 8 | 0101 | DEC | NON-INVERTED | 1110 |
| 9 | 0000 | INC | NON-INVERTED | 1101 |
| 10 | 0000 | DEC | NON-INVERTED | 1101 |
| 11 | 0101 | INC | NON-INVERTED | 1101 |
| 12 | 0101 | DEC | NON-INVERTED | 1101 |
| 13 | 0000 | INC | NON-INVERTED | 1011 |
| 14 | 0000 | DEC | NON-INVERTED | 1011 |
| 15 | 0101 | INC | NON-INVERTED | 1011 |
| 16 | 0101 | DEC | NON-INVERTED | 1011 |
| 17 | 0000 | INC | NON-INVERTED | 0111 |
| 18 | 0000 | DEC | NON-INVERTED | 0111 |
| 19 | 0101 | INC | NON-INVERTED | 0111 |
| 20 | 0101 | DEC | NON-INVERTED | 0111 |
| 21 | 0000 | INC | NON-INVERTED | 1100 |
| 22 | 0000 | INC | INVERTED | 1100 |
| 23 | 0000 | DEC | NON-INVERTED | 1100 |
| 24 | 0000 | DEC | INVERTED | 1100 |
| 25 | 0101 | INC | NON-INVERTED | 1100 |
| 26 | 0101 | INC | INVERTED | 1100 |
| 27 | 0101 | DEC | NON-INVERTED | 1100 |
| 28 | 0101 | DEC | INVERTED | 1100 |

FIG. 5

METHOD AND APPARATUS FOR RAM BUILT-IN SELF TEST (BIST) ADDRESS GENERATION USING BIT-WISE MASKING OF COUNTERS

BACKGROUND

The present invention relates generally to integrated circuit memory devices and, more particularly, to a method and apparatus for generating a selected subset of memory addresses associated with a semiconductor memory array.

As Application Specific Integrated Circuit (ASIC) technologies expand into new markets, the need for denser embedded memory increases. For example, markets in portable and multimedia applications such as cellular phones and personal digital assistants demand increased density of embedded memory for higher function and lower power consumption. In order to accommodate this increased demand, embedded DRAM (eDRAM) macros have been offered in state-of-the-art ASIC portfolios. The integration of eDRAM into ASIC designs has intensified the focus on how best to test a high-density macro as complex as DRAM in a logic test environment. The traditional use of Direct Memory Access (DMA), however, proves to be costly in terms of silicon area, available I/O pins, wiring complexity and test time.

Accordingly, a more attractive solution to the logic test problem has been through the use of a Built-In Self Test (BIST) system that is adapted to provide all of the elements needed to provide high fault coverage on DRAM. Such elements include, for example, the calculation of a two-dimensional redundancy solution, pattern programming flexibility, at-speed testing, and test mode application for margin testing. The development of BIST has allowed the testing of large embedded memories on logic testers without added die area of performance testing inaccuracies incurred with isolation multiplexers.

A BIST unit, in response to commands from an associated test board, typically tests the entire storage cell and provides an indicia of the results of the test procedure. However, in many situations, limiting the test procedures to those involving the entire memory unit can result in an unsatisfactory test procedure. For example, in testing a prototype memory unit, the failure of the prototype memory unit may be the result of either a failure of the BIST unit itself or a design flaw in a portion of the memory unit. In either situation, the mere failure of the test procedure does not, by itself, provide enough information to localize the specific problem with sufficient accuracy so as to enable a resolution of the same.

One existing approach to limiting the portion of the memory unit to be tested by the BIST unit is to control the upper limit of the storage cell array addresses being tested. With this approach, the array address upper limit may then be varied, thereby systematically expanding the testing of the storage cell array to include the entire storage cell array. Unfortunately, this particular test procedure is not particularly useful for any address above the address including the first-identified defect. Moreover, this approach is particularly unsatisfactory when the identified defect occurs at a relatively low address.

Another existing approach has been to implement boundary registers which include preprogrammed upper and lower address limits therein. During operation of the BIST circuitry, the boundary registers determine the address at which the testing procedure begins and ends. Despite the ability to select an address subset, however, this approach still does not allow for selective skipping of any addresses falling within the upper and lower address limits.

BRIEF SUMMARY

The above discussed and other drawbacks and deficiencies of the prior art are overcome or alleviated by a method for generating a selected subset of memory addresses associated with a semiconductor memory array. In an exemplary embodiment of the invention, the method includes configuring an address counter to generate addresses corresponding to locations within the memory array. A mask register is programmed with a series of masking bits, the value of the masking bits determining whether corresponding address bits in the address counter are masked or not masked. Any of the address bits in the address counter corresponding to a masked bit are masked from a counting operation performed by the address counter, thereby causing the address counter to generate the selected subset of memory addresses.

In a preferred embodiment, a mask inversion signal is coupled with the series of masking bits programmed in said mask register. The mask inversion signal selectively causes any masked bits in the address counter to become unmasked, and unmasked bits in the address counter to become masked. Further, the address counter may be initialized with a starting address therein through the use of a scan chain. Preferably, the mask register is also programmed through the scan chain. The address counter further includes a binary counter which may be incremented or decremented, based upon the value of an increment/decrement signal applied thereto.

BRIEF DESCRIPTION OF THE DRAWINGS

Referring to the exemplary drawings wherein like elements are numbered alike in the several FIGS:

FIGS. 3(a) and 3(b) are tables which illustrate an exemplary count sequence for an 8-bit configurable address counter shown in FIG. 1;

FIGS. 4(a) and 4(b) are tables which illustrate another exemplary count sequence for the 8-bit configurable address counter shown in FIG. 1, wherein a mask inversion function is implemented; and FIG. 5 is a table illustrating a list of simulation conditions that were applied to a 4-bit address counter as shown in FIG. 2.

DETAILED DESCRIPTION

Figure 1:
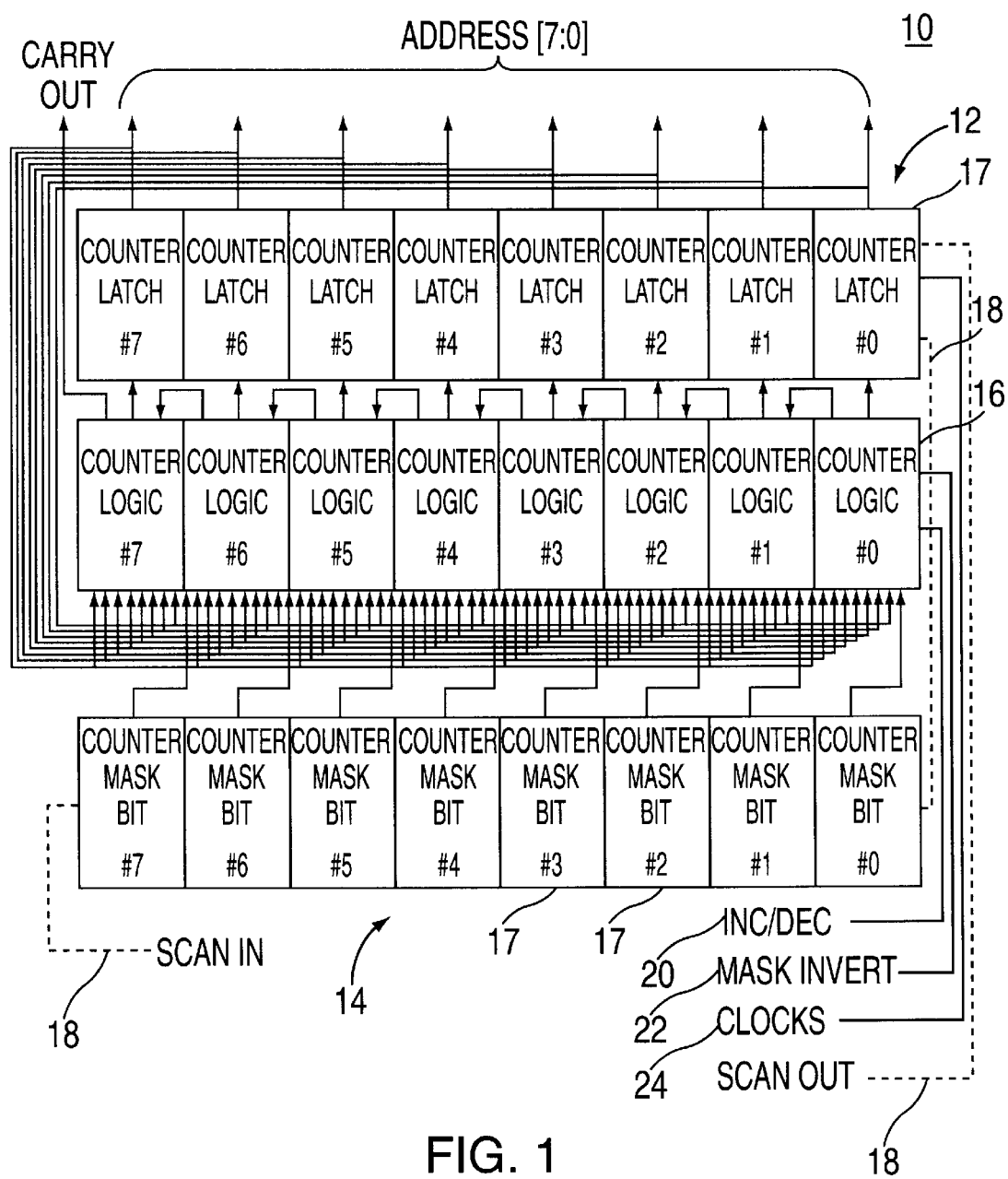
FIG. 1 is a block diagram of a configurable address counter, in accordance with an embodiment of the invention.

Although existing address generators provide the ability to apply relatively simple test patterns, they fall short of applying all of the types of test coverage required for DRAM arrays. A primary drawback of these architectures is their inability to sequence through an address space smaller than those used for the full-array testing. Some DRAM BIST address generation methods, as mentioned above, attempt to eliminate some of these limitations. However, none have achieved the level of sophistication for implementation of certain specific (and possibly proprietary) memory test patterns being used in BIST.

For example, a particular address generation scheme mentioned above involves the use of address range registers to limit the address space traversed by an address counter. The reason given for this approach centers on the testing of a prototype product that may not have fully functional arrays. Through the use of the address range registers, the tested address space can be reduced so that the test is only applied to that portion of the array which is functional. While the use of these address range registers may provide more flexibility with regard to the size of the address space used for an entire test, they do not solve the test complexity problem associated with the complex, proprietary memory test patterns.

In order to perform such tests with multiple array spaces of varying size, multiple counters would be implemented, each having its own set of address range registers. The additional counters and address range registers would add significantly to the size of the address generator, since each address counter would use two additional registers to store the minimum and maximum range values. A further addition to device real estate results from the compare and counter reset logic used to limit each counter to the range specified by the registers.

Moreover, another drawback to this approach is the inability to skip selected addresses within a partial-array address space. As described previously, complex test patterns generally allow for non-sequential addressing of the array. In order to implement this for the above described technique, the bounded address range approach would employ individual counters and address registers for each contiguous portion of the address space. The quantity and size of the hardware required to implement such a design would be prohibitive.

Therefore, in accordance with an embodiment of the invention, a method and apparatus for generating and testing selected addresses of a semiconductor memory array is disclosed, which thereby allows any desired subset of address bits to be masked from a counter function.

If it is assumed that the beginning and end of the smallest consecutive addressing segments are-separated by a number that is divisible by powers of two, selective bits on a single counter can be used to generate the desired address sequence. While this may appear to be a large restriction on the dimensions and relative spacing of these consecutively addressed regions, smaller regions with $2^n$ lengths can always be combined to form larger regions with fewer restrictions. This method of selecting a subset of the counter bits to traverse a reduced address space becomes clearer through the use of some simple examples.

For a full-array address space, chosen in one dimension to be 16 bits in length, a 4-bit binary counter may be used (to count from 0 to 15) in order to test all of the bits in the single dimension. However, these 16 bits may also be further divided into smaller regions for reduced address space testing. One simple case involves testing only the low-order 8 bits in the 16-bit address sequence. To do so, the counter addresses bits 0 through 7 before subsequently producing a carry. This task is precisely the function of a 3-bit binary counter. Or, if the high-order bit of the initial 4-bit counter could be ignored, this reduced address space counting would also be possible. On the other hand, if the high-order 8 bits are chosen to be the total partial-array address space, then the counter must sequence from a count of 8 to 15. This function resembles a 4-bit binary counter that is initialized with a value of 8. In both cases, the low-order 3 bits perform the count, while the high-order 4 bit is static and merely selects between the first group of 8 addresses and the second group of 8 addresses. Thus, a counter that could be initialized with a value, and thereafter have a subset of bits participate in the count, would produce the desired addressing sequence.

Such a method of generating reduced address spaces is applicable to more than just the high and low-order partial array address spaces. Another example involves the addressing of every other bit within the 16-bits described above. In doing so, the lowest order bit in the 4-bit counter is held constant while the high order 3 bits perform the count. Depending on the initial state of the low order bit, it is possible to implement either of the two partial-array address spaces defined by this sequence. A slightly more complex example involves any consecutive 4-bit address space contained within the same 16-bit single-dimension address space. Generating the appropriate address sequence in that case involves incrementing or decrementing the lowest order 2 bits of the 4 bit binary counter. The 2 high-order bits would then select one of the four possible 4-bit address spaces that exist in the overall 16-bit address range. By masking the two high-order bits of the counter (so that they retain their value and excluded from the count and the carry generation process), continual addressing within the desired reduced address space is achieved.

A configurable counter has developed that allows any subset of bits to be masked from the counter function. Such a design thus enables the counter to limit the addresses generated to a subset of the total address space. However, the test patterns described hereinafter are not limited in their entire application to the same partial-array address space. Rather, they are sequenced from one address space to the next, as a test (e.g., a "disturb") is completed in one region and is thereafter repeated for the remainder of the DRAM array. In order to do this, the bits that are normally masked during the counting process are incremented or decremented at selective points in the test without affecting the remaining bits in the counter. This is achieved by using a "mask invert function" that selectively transfers the count operation from the non-masked bits to the masked bits in order to move the counter to the start of the next partial-array address space.

Referring now to FIG. 1, there is shown a block diagram which illustrates a configurable address counter 10, capable of the functions discussed above, in accordance with an embodiment of the invention. Counter 10 includes a pair of registers, a counter register 12 to contain a stored counter value therein, and a mask register 14 for storing a mask function-(i.e., masking bits) therein. In addition, counter 10 includes counter logic 16 to process both the bit masking and the counting (increment/decrement) operations, as will be explained in greater detail later. By way of example only, the counter register 12, masking register 14 and logic 16 are shown as part of an 8-bit counter in FIG. 1. However, it will be understood that a greater or lesser number of bits may be implemented for counter 10.

In a preferred embodiment, the storage elements included in counter register 12 and mask register 14 comprise level-sensitive scan device (LSSD) latches 17. The latches 17 in counter register 12 are designated in FIG. 1 as Counter Latch #0–#7, and latches 17 in mask register 14 are designated by Counter Mask Bit #0–#7. Both the counter register 12 and the mask register 14 are placed into a scan-chain 18 to enable the testing of the BIST circuitry, as well as for preloading of the contents of the counter register 12 and mask register 14 at the beginning of a test. The counter 10 receives an increment/decrement signal 20 (inputted to counter register 12 through control logic 16) to control the incrementing or decrementing of the counter 10, thus enabling both ascending and descending address sequences.

A mask invert signal 22 is generated directly by each pattern instruction word in a given test sequence and enables the masking bits to be inverted at select points in the test pattern. In other words, bits that were masked in a previous test sequence then become unmasked, and vice versa.

Thereby, the mask invert function allows the test pattern to control every bit within the counters, even though many of these bits may normally be masked during the application thereof.

The timing of address counter 10 is controlled by input clock signals 24, which are implemented in accordance with level-sensitive clocking methodologies, and collectively include an A clock, a B clock and a C clock. While the use of such multiple clocking schemes are common in conjunction with LSSD designs, it should be understood that address counter 10 may also be embodied by other storage device configurations which may be controlled by a single clock signal.

Figure 2:
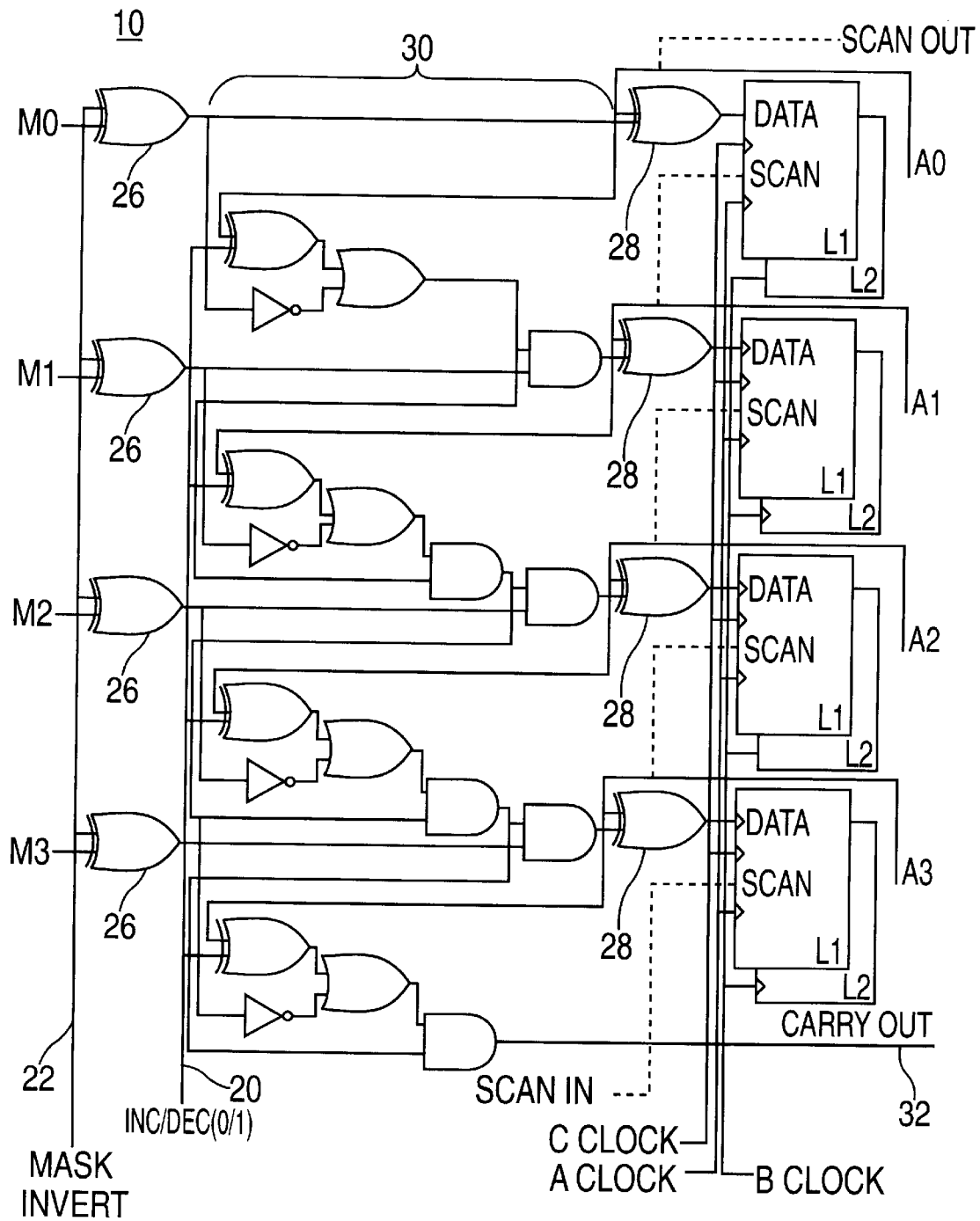
FIG. 2 is a schematic diagram of the logic elements included in the address counter, shown as a 4-bit example.

Referring now to FIG. 2, there is shown a schematic diagram of the various logic elements included within address counter 10. For purposes of illustration only, counter 10 is depicted as a 4-bit embodiment. The mask invert signal 22 is paired with each masking bit (again, 4 bits are shown in this example) contained in mask register 14, and is then inputted to a first series of exclusive OR (XOR) gates 26. If the value of the mask invert signal 22 is "0" (meaning no mask invert function), then the value of each masking bit (M0, M1, M2 and M3) is passed through the respective XOR gate 26. However, if the value of the mask invert signal 22 is "1" (meaning a mask invert function), then the value of each masking bit is inverted by through the respective XOR gate 26.

A second series of XOR gates 28 is coupled to a series of master-slave latch pairs L1–L2 which make up the counter register 12. The outputs of XOR gates 28 determine the state of the stored data bit in latch pairs L1–L2. Again, the master-slave latch pairs L1–L2 depict one possible implementation of counter register 12, as single latch elements may also be used in lieu thereof.

Disposed between the first series of XOR gates 26 and second series of XOR gates 28 is a logic block (designated generally by 30) which incorporates the various counter features, including the increment/decrement signal 20, the masking bits (outputs of XOR gates 26), and a carry out signal 32. The particular gates of logic block 30 shown in FIG. 2 are meant to be illustrative in nature, thus representing one possible implementation of counter logic 16. It should further be noted that the use of XOR gates 26 and 28 represent one possible implementation of the mask invert function and the counter management function. Alternatively, these functions could be incorporated into logic 30 without the use of any XOR logic.

Figures 3A, 3B:
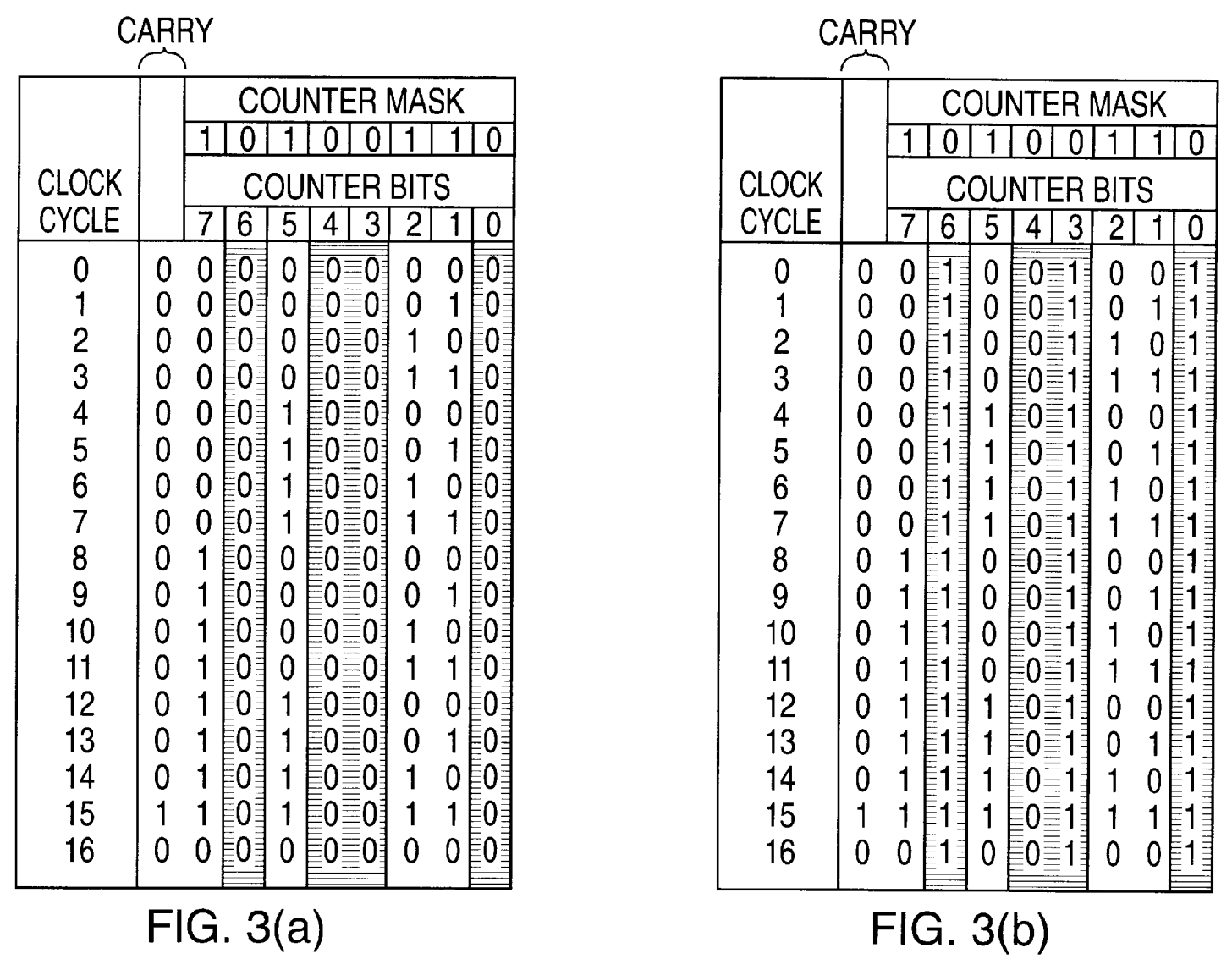

FIGS. 3(a) and 3(b) illustrate an exemplary count sequence for a the 8-bit address counter embodiment shown in FIG. 1. In this example, 4 of the 8 counter bits are removed from the count sequence through the use of a "10100110" mask (wherein the masked counter bits are shown shaded). In FIG. 3(a), the initial states of all the counter latches are zero. As the 16 C/B clocks are applied, the counter 10 is caused to increment using only the 4 bits that are not masked (counter bits 1, 2, 5 and 7). After the $16^{th}$ clock signal is applied, the counter 10 has reset to all zeros and has produced a carry. It will be noted that the counter rollover and the corresponding carry occur when only the enabled counter bits (i.e., counter bits 1, 2, 5 and 7) are ones, completely independent of the masked bits. In FIG. 3(b), the same "10100110" mask is applied to the counter 10, illustrating a case of a non-zero initial counter value. As can be seen, the masked bits do not participate in the count and retain their individual values regardless of whether they are zeros or ones. Although the examples in FIGS. 3(a) and 3(b) illustrate the function of the counter 10 during increment counting, the same masking and carry functions also apply during decrement sequences.

Referring now to FIGS. 4(a) and 4(b), a count sequence generated by the same masking function and initial counter values as FIGS. 3(a) and 3(b) is shown, after the mask invert signal 22 has been activated. This time, only the masked (shaded) bits are incremented with each applied clock signal. As more clock cycles are applied, all of the masked bits eventually become ones, and are subsequently reset to zero as a carry is generated. The feature allows for migration from one reduced address space to the next by changing the specific address bits that normally lie outside the partial-array address space of interest.

Finally, the verification and demonstration of the capabilities of address counter 10 may be assessed through the use of a Hardware Description Language (HDL) simulator. In one aspect, Cadence Verilog XL® was used to simulate the design of address counter 10 through the use of both behavioral and structural constructs. The simulation included an instantiation of a single, 4-bit address counter, as shown in FIG. 2. A series of values were assigned to the counter inputs which were then scan-initialized using A/B LSSD clocks, and were subsequently clocked using C/B clocks. Tasks were written in Verilog to handle the application of these clocks and the formatting of the output. The module definition of the 4-bit counter 10 instantiates four instances of an LSSD latch, as well as the various logic gates shown in FIG. 2 and the interconnects included therein.

FIG. 5 is a table which illustrates a list of 28 simulation conditions that were applied to the 4-bit address counter 10. The first four simulations tested the function of the counter 10 as a normally operating binary counter (i.e., no bit masking) for both zero and non-zero starting addresses. The next sixteen simulations used scanned-in mask functions (represented by a mask value having one "0" bit) that disabled one of the bits in the counter, and tested counter 10, with both zero and non-zero starting addresses. As can be seen, the counter 10 was simulated with the masked bit being inserted at all four mask bit locations. Finally, the counter 10 was further simulated two bits being masked, and again done for zero and non-zero starting addresses. In addition, these simulations were executed with and without the mask being inverted. In each case, counter 10 operated as intended. That is, all masked bits were properly skipped during the counting process, and a carry signal was generated when the counter value for the nonmasked bits overflowed. Furthermore, the mask inversion function properly allowed for this count sequencing to be applied to the normally-masked counter bits.

By replacing a standard binary counter contained in existing BIST address generators with the present counter 10, significant flexibility can be gained. In particular, reduced address space regions may be repeatedly sequenced therethrough and, upon the completion of a test of a particular region, the mask may be inverted to test the next partial-array address space.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodi-

What is claimed is:

1. A method for generating a selected subset of memory addresses associated with a semiconductor memory array, the method comprising:

configuring an address counter to generate addresses corresponding to locations within the memory array; and programming a mask register with a series of masking bits, the value of said masking bits determining whether corresponding address bits in said address counter are masked or not masked;

wherein any of said address bits in said address counter corresponding to a masked bit are masked from a counting operation performed by said address counter, thereby causing said address counter to generate the selected subset of memory addresses.

2. The method of claim 1, further comprising:

coupling a mask inversion signal with said series of masking bits programmed in said mask register;

wherein said mask inversion signal selectively causes any masked bits in said address counter to become unmasked, and unmasked bits in said address counter to become masked.

3. The method of claim 2, wherein said address counter may be initialized with a starting address therein.

4. The method of claim 3, wherein said address counter is initialized through a scan chain.

5. The method of claim 3, wherein said mask register is programmed through a scan chain.

6. The method of claim 2, wherein:

said address counter further comprises a binary counter; and said address counter may be incremented or decremented, based upon the value of an increment/decrement signal applied thereto.

7. A method for testing a semiconductor memory array having a built-in self test (BIST) device embedded therein, the method comprising:

configuring an address counter within the BIST device to generate addresses corresponding to locations within the memory array; and programming a mask register with a series of masking bits, the value of said masking bits determining whether corresponding address bits in said address counter are masked or not masked;

wherein any of said address bits in said address counter corresponding to a masked bit are masked from a counting operation performed by said address counter, thereby allowing only a desired subset of the semiconductor memory array to be tested by the BIST unit.

8. The method of claim 7, further comprising:

coupling a mask inversion signal with said series of masking bits programmed in said mask register;

wherein said mask inversion signal selectively causes any masked bits in said address counter to become unmasked, and unmasked bits in said address counter to become masked.

9. The method of claim 8, wherein said address counter may be initialized, with a starting address therein.

10. The method of claim 9, wherein said address counter is initialized through a scan chain.

11. The method of claim 9, wherein said mask register is programmed through a scan chain.

12. The method of claim 8, wherein:

said address counter further comprises a binary counter; and said address counter may be incremented or decremented, based upon the value of an increment/decrement signal applied thereto.

13. An apparatus for testing selected addresses of a semiconductor memory array, comprising:

a built-in self test (BIST) device including an address counter for generating test address signals representing semiconductor array locations to be tested; and a mask register for selectively masking specific bit positions in said address counter, said mask register containing a series of programmed masking bits therein, the value of said masking bits determining whether corresponding address bits in said address counter are masked or not masked;

wherein any of said address bits in said address counter corresponding to a masked bit are masked from a counting operation performed by said address counter, thereby allowing only a desired subset of the semiconductor memory array to be tested by said BIST device.

14. The apparatus of claim 13, further comprising:

a mask inversion signal, coupled with said series of masking bits programmed in said mask register;

wherein said mask inversion signal selectively causes any masked bits in said address counter to become unmasked, and unmasked bits in said address counter to become masked.

15. The apparatus of claim 14, wherein said address counter may be initialized with a starting address therein.

16. The apparatus of claim 15, wherein said address counter is initialized through a scan chain.

17. The apparatus of claim 15, wherein said mask register is programmed through a scan chain.

18. The apparatus of claim 14, wherein:

said address counter further comprises a binary counter; and said address counter may be incremented or decremented, based upon the value of an increment/decrement signal applied thereto.

19. The apparatus of claim 14, wherein said mask inversion signal is coupled with said series of masking bits through a series of exclusive OR (XOR) logic gates.

20. The apparatus of claim 13, wherein said mask register and said address counter comprise a series of level-sensitive scan device (LSSD) latches.

* * * * *